(12) United States Patent
Chu et al.

(10) Patent No.: US 9,972,809 B2
(45) Date of Patent: May 15, 2018

(54) ARRAY SUBSTRATE, ORGANIC LIGHT-EMITTING DIODE DISPLAY PANEL, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Hao Chu, Beijing (CN); Jing Hu, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days. days.

(21) Appl. No.: 15/134,927

(22) Filed: Apr. 21, 2016

(65) Prior Publication Data

US 2017/0062772 A1    Mar. 2, 2017

(30) Foreign Application Priority Data

Sep. 2, 2015   (CN) .......................... 2015 1 0556332

(51) Int. Cl.
*H01L 51/52* (2006.01)
*H01L 27/32* (2006.01)
*H01L 27/12* (2006.01)

(52) U.S. Cl.
CPC ...... *H01L 51/5284* (2013.01); *H01L 27/3262* (2013.01); *H01L 27/3276* (2013.01);
(Continued)

(58) Field of Classification Search
CPC .................................................. H01L 51/5284
See application file for complete search history.

(56) References Cited

U.S. PATENT DOCUMENTS

2009/0236976 A1*   9/2009   Lee ..................... H01L 51/5284
                                                                  313/504
2011/0031876 A1   2/2011   Park et al.
(Continued)

FOREIGN PATENT DOCUMENTS

CN           1921141 A      2/2007
CN         103500753 A      1/2014
(Continued)

OTHER PUBLICATIONS

First Office Action for Chinese Application No. 201510556332.2, dated Jun. 28, 2017, 6 Pages.
(Continued)

*Primary Examiner* — Fernando L Toledo
*Assistant Examiner* — Valerie N Newton
(74) *Attorney, Agent, or Firm* — Brooks Kushman P.C.

(57) ABSTRACT

The present disclosure provides an array substrate, an OLED display panel and a display device. The array substrate includes a light-emitting region and a non-light-emitting region, wherein an anode, an organic light-emitting layer and a cathode on a base substrate are arranged at the non-light-emitting region, and a metal structure on the base substrate is arranged at the non-light-emitting region, wherein the array substrate further comprises a first light-absorbing layer arranged at the non-light-emitting region and configured to absorb a light beam from the organic light-emitting layer and arriving at the non-light-emitting region, and the cathode is transparent, and the anode is transparent or nontransparent.

19 Claims, 4 Drawing Sheets

(52) U.S. Cl.
CPC .......... *H01L 27/124* (2013.01); *H01L 27/322* (2013.01); *H01L 51/5206* (2013.01); *H01L 51/5234* (2013.01)

(56) References Cited

U.S. PATENT DOCUMENTS

| | | | |
|---|---|---|---|
| 2015/0049030 A1* | 2/2015 | Her | G06F 3/0412 345/173 |
| 2016/0020262 A1* | 1/2016 | Ahn | H01L 27/3258 257/40 |
| 2016/0181343 A1 | 6/2016 | Wang et al. | |
| 2016/0268362 A1* | 9/2016 | Shi | H01L 27/3267 |

FOREIGN PATENT DOCUMENTS

| | | |
|---|---|---|
| CN | 103730484 A | 4/2014 |
| CN | 104681592 A | 6/2015 |

OTHER PUBLICATIONS

Second Office Action for Chinese Application No. 201510556332.2, dated Sep. 13, 2017, 4 Pages.
Third Office Action for Chinese Application No. 201510556332.2, dated Dec. 11, 2017, 4 Pages.

\* cited by examiner

ARRAY SUBSTRATE, ORGANIC LIGHT-EMITTING DIODE DISPLAY PANEL, AND DISPLAY DEVICE

CROSS-REFERENCE TO RELATED APPLICATION

The present application claims a priority of the Chinese patent application No. 201510556332.2 filed on Sep. 2, 2015, which is incorporated herein by reference in its entirety.

TECHNICAL FIELD

The present disclosure refers to the field of display technology, in particular to an array substrate, an organic light-emitting diode (OLED) display panel, and a display device.

BACKGROUND

As compared with a liquid crystal display panel, an OLED display panel is highly competitive due to its features such as self-luminescence, low power consumption, dead-zone-free viewing angle, rapid response and high contrast, and thus has been considered as a mainstream of the display panel in future.

SUMMARY

An object of the present disclosure is to provide an array substrate, an OLED display panel and a display device, so as to prevent the contrast from being degraded.

In one aspect, the present disclosure provides in some embodiments an array substrate, a light-emitting region and a non-light-emitting region, wherein an anode, an organic light-emitting layer and a cathode on a base substrate are arranged at the non-light-emitting region, and a metal structure on the base substrate is arranged at the non-light-emitting region, wherein the array substrate further comprises a first light-absorbing layer arranged at the non-light-emitting region and configured to absorb a light beam from the organic light-emitting layer and arriving at the non-light-emitting region, and the cathode is transparent, and the anode is transparent or nontransparent.

Alternatively, the first light-absorbing layer is arranged between the metal structure and the anode.

Alternatively, the non-light-emitting region includes a first non-light-emitting region; the metal structure includes a gate electrode, a source electrode and a drain electrode of a TFT arranged at the first non-light-emitting region, a gate line connected to the gate electrode of the TFT and a data line connected to the source electrode of the TFT; and the first light-absorbing layer is arranged at the first non-light-emitting region.

Alternatively, the anode includes a first transparent conductive layer, a second transparent conductive layer and a nontransparent metal layer arranged between the first transparent conductive layer and the second transparent conductive layer.

Alternatively, the cathode is translucent.

Alternatively, the anode is made of a transparent conductive material.

Alternatively, the array substrate further includes a second light-absorbing layer arranged at the non-light-emitting region, and the second light-absorbing layer is located between the metal structure and the base substrate, or located at a side of the base substrate away from the metal structure.

Alternatively, the second light-absorbing layer is arranged at the first non-light-emitting region.

Alternatively, the first light-absorbing layer and the second light-absorbing layer are made of a black matrix material.

Alternatively, the non-light-emitting region further includes a second non-light-emitting region arranged at a non-display region.

Alternatively, the metal structure further includes a metal line arranged at the second non-light-emitting region.

Alternatively, the first light-absorbing layer is formed subsequent to the metal structure, and followed by the formation of the anode, so as to form the first light-absorbing layer between the metal structure and the anode.

Alternatively, the organic light-emitting layer at least includes light-emitting molecules capable of emitting red, green and blue light beams.

Alternatively, the organic light-emitting layer includes light-emitting molecules capable of emitting white light beams.

Alternatively, the array substrate further includes a color filter film arranged at the light-emitting region and at a light-exiting side.

Alternatively, the first light-absorbing layer is arranged at both the first non-light-emitting region and the second non-light-emitting region.

In another aspect, the present disclosure provides in some embodiments an OLED display panel including the above-mentioned array substrate.

In yet another aspect, the present disclosure provides in some embodiments a display device including the above-mentioned OLED display panel.

According to the array substrate, the OLED display panel and the display device in the embodiments of the present disclosure, the first light-absorbing layer is provided so as to absorb the light beam from the organic light-emitting layer and arriving at the non-light-emitting region. As a result, it is able to prevent the light beam from being reflected by the metal structure and then transmitted through the non-light-emitting region, thereby to improve the contrast. In addition, the fist light-absorbing layer may further absorb an ambient light beam entering the non-light-emitting region, so as to prevent the ambient light beam from being reflected by the metal structure and transmitted through the non-light-emitting region, thereby to further improve the contrast.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 2b is a sectional view of the array substrate along line A-A' in FIG. 2a;

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
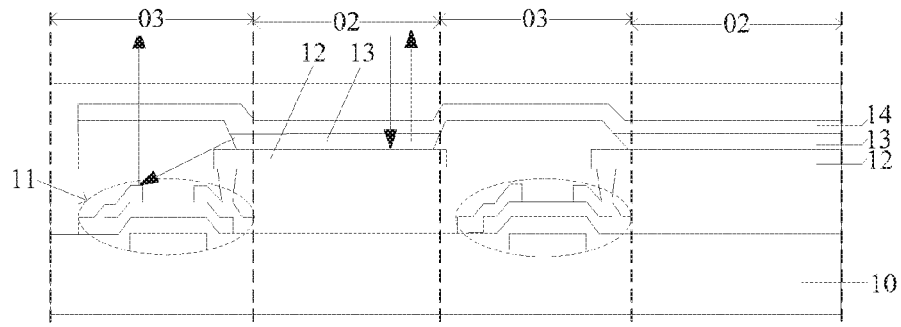
FIG. 1 is a schematic view showing an array substrate in the related art.

For a top-emission OLED display panel, as shown in FIG. 1, an array substrate 01 includes a Thin Film Transistor (TFT) 11 arranged on a base substrate 10 and at a non-light-emitting region 03, an anode 12 electrically connected to a drain electrode of the TFT and arranged at a light-emitting region 02, an organic light-emitting layer 13 arranged on the anode 12, and a cathode 14 arranged on the organic light-emitting layer 13. The anode 12 is nontransparent, and the cathode 14 is transparent.

An operating principle of the top-emission OLED display panel will be described as follows. A part of light beams from the organic light-emitting layer 13 are transmitted directly through the transparent cathode 14, and the other part of the light beams are reflected by the nontransparent anode 12 and then transmitted through the transparent cathode 14.

However, the light beams from the organic light-emitting layer 13 are not always perpendicular to the base substrate 10, and a part of the light beams will be directed to the non-light-emitting region and then reflected by metal structures at the non-light-emitting region, e.g., the TFT 11 and a signal line. At this time, the contrast will be degraded and a display effect will be adversely affected.

Figure 2A:
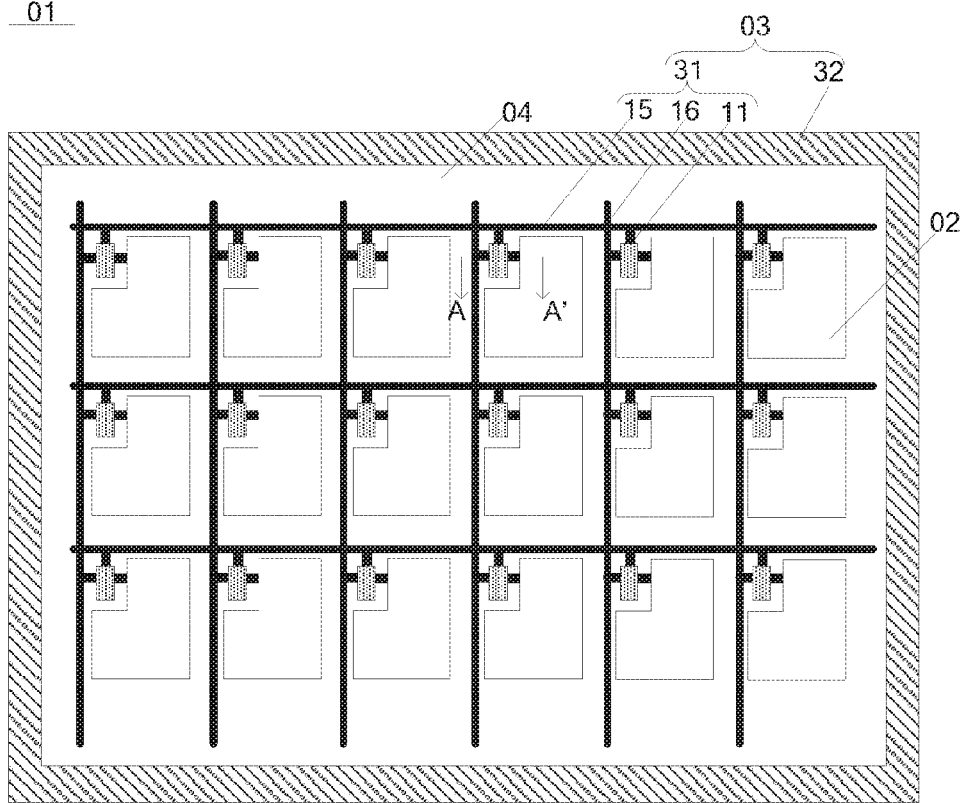
FIG. 2a is a top view of an array substrate according to at least one embodiment of the present disclosure.
Figure 2B:
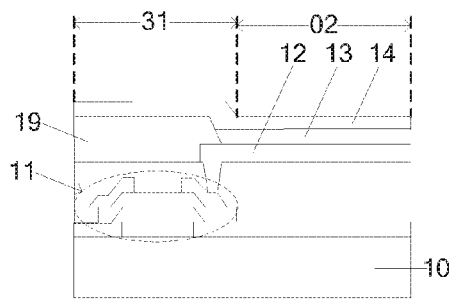
Figure 2C:
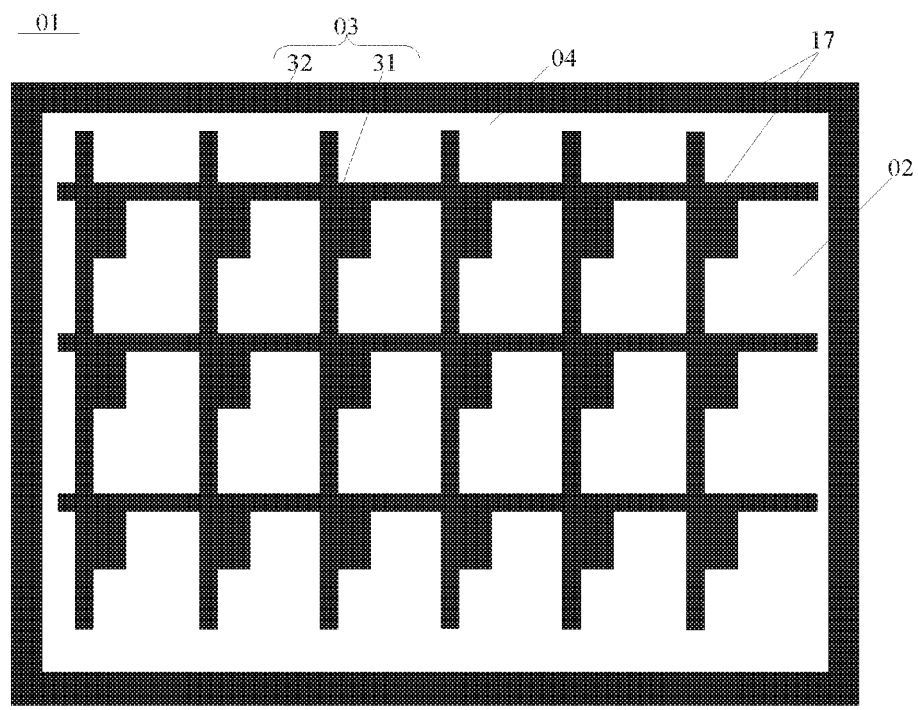
FIG. 2c is a schematic view showing a first light-absorbing layer according to one embodiment of the present disclosure.
Figure 2D:
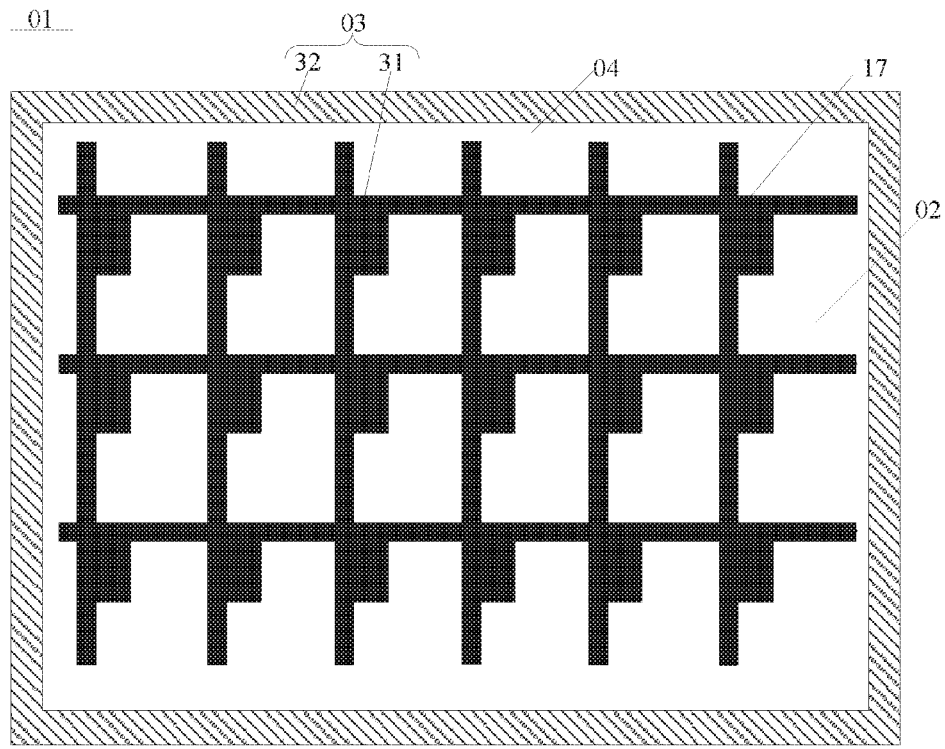
FIG. 2d is another schematic view showing a first light-absorbing layer according to one embodiment of the present disclosure.

The present disclosure provides in some embodiments an array substrate 01 which, as shown in FIGS. 2a and 2b, includes a light-emitting region 02 and a non-light-emitting region 03. The light-emitting region 02 includes an anode 12, an organic light-emitting layer 13 and a cathode 14 which are arranged on a base substrate 10, and the non-light-emitting region 03 includes a metal structure arranged on the base substrate 10. As shown in FIGS. 2c and 2d, the array substrate 01 further includes a first light-absorbing layer 17 arranged at the non-light-emitting region 03 and configured to absorb a light beam from the organic light-emitting layer 13 and arriving at the non-light-emitting region 03. The cathode 14 is transparent, and the anode 12 is transparent or nontransparent.

It should be appreciated that, firstly, as shown in FIGS. 2a and 2b, the light-emitting region 02 is located at a display region 04. To be specific, a plurality of display units may be arranged in a matrix form at the display region 04, and each display unit includes a TFT 11, the anode 12, the organic light-emitting layer 13 and the cathode 14. In this case, the anodes 12, the organic light-emitting layers 13 and the cathodes 14 of the respective display units are arranged at the light-emitting region 02.

The non-light-emitting region 03 includes a first non-light-emitting region 31 arranged at the display region 04 and a second non-light-emitting region 32 arranged at a non-display region.

At the first non-light-emitting region 31, the metal structure includes a gate electrode, a source electrode and a drain electrode of the TFT arranged on the base substrate 10, a gate line connected to the gate electrode of the TFT and a data line connected to the source electrode of the TFT. In addition, a pixel definition layer 19 is also arranged at the first non-light-emitting region 31 so as to separate the organic light-emitting layers 13 of the adjacent display units from each other. At the second non-light-emitting region 32, the metal structure includes a metal line.

Here, the structure of the TFT 11 is not particularly defined, i.e., the TFT may be of a top-gate type or a bottom-gate type. In addition, a material of a semiconductor active layer is not particularly defined herein either, i.e., the active layer may be made of a semiconductor material such as a-Si, poly-Si, a metal oxide or an organic material.

In addition, with respect to any display unit, the number of the TFTs 11 included in the display unit is not particular defined. When any one of the display units includes at least two TFTs 11, a connection line for connecting the at least two TFTs is also arranged at the first non-light-emitting region 31.

Secondly, as mentioned above, the metal structure may include the TFT 11, the gate line 15, the data line 16 and the connection line arranged at the first non-light-emitting region 31. Of course, it may also include the metal line arranged at the second non-light-emitting region 32.

Thirdly, the first light-absorbing layer 17 is configured to absorb the light beam from the organic light-emitting layer 13 and arriving at the non-light-emitting region 03. To be specific, the first light-absorbing layer 17 may be configured to absorb a light beam from the organic light-emitting layer 13 and reflected by the metal structure toward the non-light-emitting region 03, or absorb a light beam from the organic light-emitting layer 13 and directly entering the non-light-emitting region 03 and the above-mentioned reflected light beam.

Hence, a position of the first light-absorbing layer 17 is not particularly defined in the embodiments of the present disclosure. In other words, the layer where the first light-absorbing layer 17 is located as well as whether or not it is located at the first non-light-emitting region 31 or at both the first non-light-emitting region 31 and the second non-light-emitting region 32 are not particularly defined herein.

In addition, a material of the first light-absorbing layer 17 is not particularly defined herein, and the first light-absorbing layer 17 may be made of ink, graphite, black resin (a black matrix material), or the like.

Fourthly, when the cathode 14 is transparent, the anode 12 is nontransparent and the array substrate 01 is applied to an OLED display device, the display device is top-emission display device. When the cathode 14 and the anode 12 are both transparent and the array substrate 01 is applied to the OLED display device, the display device is a dual-emission display device.

The organic light-emitting layer 13 is arranged above the metal structure, and the light beam from the organic light-emitting layer 13 may easily be directed to the metal structure. When the light beam is reflected by the metal structure toward the cathode 14, the contrast will be adversely affected. Hence, the transparent cathode 14 is provided in the embodiments of the present disclosure. However, the light beam from the organic light-emitting layer 13 is seldom reflected by the organic light-emitting layer toward the anode 12, so the anode 12 may be transparent or nontransparent.

Alternatively, the first light-absorbing layer 17 is arranged at a side of the metal structure away from the base substrate 10.

Fifthly, in order to improve the luminescence property, at the light-emitting region 02, a hole transport layer may be arranged between the organic light-emitting layer 13 and the anode 12, and an electron transport layer may be arranged between the organic light-emitting layer 13 and the cathode 14. Further, at the light-emitting region 02, a hole injection layer may be arranged between the anode 12 and the hole transport layer, and an electron injection layer may be arranged between the cathode 14 and the electron transport layer.

The organic light-emitting layer 13 at least includes light-emitting molecules capable of emitting red, green and blue light beams, and of course, it may further include light-emitting molecules capable of emitting white light beams.

Hence, for the plurality of display units arranged in a matrix form, at least three display units may be grouped, so as to emit the red, green and blue light beams respectively.

Alternatively, the organic light-emitting region 13 may merely include the light-emitting molecules capable of emitting the white light beam. In this case, the array substrate 01 further includes a color filter film arranged at the light-emitting region 02 and at a light-exiting side.

According to the array substrate 01 in the embodiments of the present disclosure, the first light-absorbing layer 17 is provided so as to absorb the light beam from the organic light-emitting layer 13 and arriving at the non-light-emitting region 02. As a result, it is able to prevent the light beam from being reflected by the metal structure and then transmitted through the non-light-emitting region 03, thereby to improve the contrast. In addition, the fist light-absorbing layer 17 may further absorb an ambient light beam entering the non-light-emitting region 03, so as to prevent the ambient light beam from being reflected by the metal structure and transmitted through the non-light-emitting region, thereby to further improve the contrast.

Figure 3:
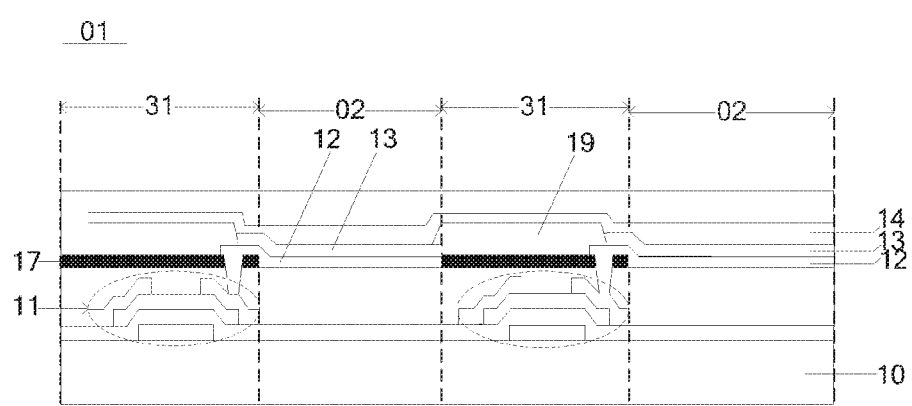
FIG. 3 is a schematic view showing the array substrate according to one embodiment of the present disclosure.

Apart from the non-light-emitting region 03, a part of the light beams from the organic light-emitting layer 13 may also be reflected by the metal structure toward the light-emitting region 02, and at this time, the display effect will be adversely affected somewhat. As shown in FIG. 3, alternatively, the first light-absorbing layer 17 may be arranged between the metal structure and the anode 12.

It should be appreciated that, in the embodiments of the present disclosure, the first light-absorbing layer 17 is formed subsequent to the metal structure, and followed by the formation of the anode 12, so as to provide the first light-absorbing layer 17 between the metal structure and the anode 12. In this way, on one hand, the first light-absorbing layer 17 may directly absorb the light beam from the organic light-emitting layer 13 toward the non-light-emitting region 03. On the other hand, the first light-absorbing layer 17 is arranged immediately adjacent to the metal structure, and even when a part of the light beams from the organic light-emitting layer 13 are reflected by the metal structure, most of them may also be absorbed by the first light-absorbing layer 17.

In addition, the first light-absorbing layer 17 may directly absorb the light beam from the organic light-emitting layer 13 toward the non-light-emitting region 03, and a part of the light beams may not arrive at the metal structure. As a result, it is able to prevent the light beams from arriving at the TFT 11, thereby to prevent the performance of the TFT 11 from being adversely affected.

The light beam from the organic light-emitting layer 13 is less likely to enter the second non-light-emitting region 32 (i.e., the non-display region), and when the array substrate 01 is applied to a display device, a bezel is arranged at the second non-light-emitting region 32. Hence, even when a part of the light beams enter the second non-light-emitting region 32, they are less likely to be transmitted to the outside. Referring to FIG. 2d, in the embodiments of the present disclosure, the first light-absorbing layer 17 is located at the first non-light-emitting region 31. Of course, the first light-absorbing layer 17 may also be arranged at both the first non-light-emitting region and the second non-light-emitting region, which is not particularly defined herein.

Alternatively, the anode 12 is nontransparent, i.e., when the array substrate 01 is applied to the OLED display device, the display device is a top-emission display device. Considering that a work function of the anode 12 is highly demanded, alternatively, the anode 12 includes a first transparent conductive layer, a second transparent conductive layer, and a nontransparent metal layer arranged between the first transparent conductive layer and the second transparent conductive layer. In this way, the anode 12 may cooperate with the organic light-emitting layer 13 in a better manner, so as to improve the luminescence property of the organic light-emitting layer 13.

Alternatively, the cathode 14 is translucent, i.e., the cathode 14 may be made of a metal material and have a sufficiently small thickness.

According to the embodiments of the present disclosure, the anode 12 is nontransparent and the cathode 14 is translucent, so it is able to form a microcavity between the anode 12 and the cathode 14. Due to an interference effect (microcavity effect) of the light beam in the microcavity, it is able to improve the output efficiency of the light beam.

Alternatively, the anode 12 is transparent, i.e., when the array substrate 01 is applied to the OLED display device, the display device is a dual-emission display device. The anode 12 may be made of a transparent conductive material such as indium tin oxide (ITO) or indium zinc oxide (IZO).

Figure 4:
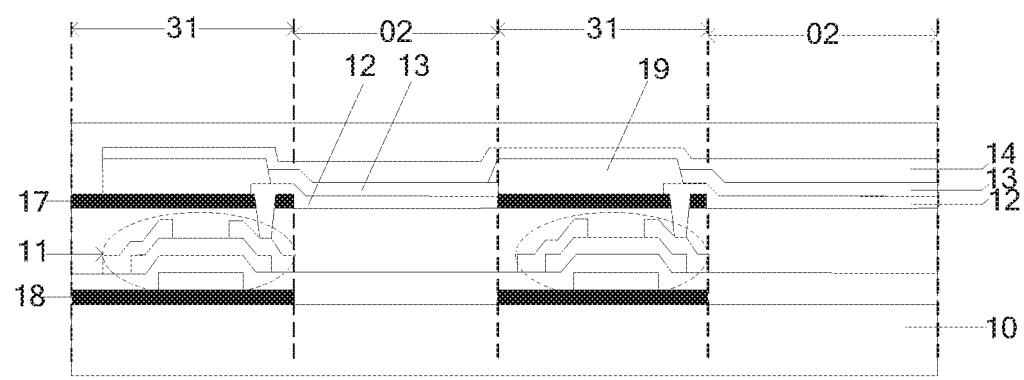
FIG. 4 is another schematic view showing an array substrate according to one embodiment of the present disclosure.

Alternatively, as shown in FIG. 4, the array substrate 01 further includes a second light-absorbing layer 18 arranged at the non-light-emitting region 03. The second light-absorbing layer 18 is located between the metal structure and the base substrate 10, or located at a side of the base substrate 10 away from the metal structure.

According to the embodiments of the present disclosure, in the case of dual-side display, the second light-absorbing layer 18 at one side of the base substrate 10 may absorb the ambient light beam entering the non-light-emitting region 03, so as to prevent the contrast from being adversely affected at the side of the base substrate 10 when the ambient light beam is reflected by the metal structure toward the base substrate 10.

Further, when the array substrate 01 is applied to the display device, a bezel is arranged at the second non-light-emitting region 32, so the reflection of the ambient light beam may not occur at the second non-light-emitting region 32. Alternatively, the second light-absorbing layer 18 is arranged at the first non-light-emitting region 31.

Further, because a black matrix material widely applied to the liquid crystal display device is cheap and has a light-absorbing function, alternatively, the first light-absorbing layer 17 and the second light-absorbing layer 18 may be both made of the black matrix material.

The present disclosure further provides in some embodiments an OLED display panel including the above-mentioned array substrate. Of course, the OLED display panel further includes a packaging layer, and the packaging layer may be a thin film packaging layer and a substrate packaging layer, which is not particularly defined herein.

The present disclosure further provides in some embodiments a display device including the above-mentioned OLED display panel and a driving module. The display device may be any product or member having a display function, such as an OLED television, an OLED display, a digital photo frame, a mobile phone or a flat-panel computer.

The above are merely the preferred embodiments of the present disclosure. It should be appreciated that, a person skilled in the art may make further modifications and improvements without departing from the spirit of the present disclosure, and these modifications and improvements shall also fall within the scope of the present disclosure.

What is claimed is:

1. An array substrate, comprising a light-emitting region and a non-light-emitting region, wherein an anode, an organic light-emitting layer and a cathode on a base substrate are arranged at the non-light-emitting region, and a metal structure on the base substrate is arranged at the non-light-emitting region, wherein
the array substrate further comprises a first light-absorbing layer and a second light-absorbing layer arranged at the non-light-emitting region and configured to absorb a light beam from the organic light-emitting layer and arriving at the non-light-emitting region, and
the cathode is transparent, and the anode is transparent or nontransparent,
wherein the first light-absorbing layer is arranged between the metal structure and the anode, the second light-absorbing layer is arranged between the metal structure and the base substrate, and the metal structure is arranged between the first light-absorbing layer and the second light-absorbing layer.

2. The array substrate according to claim 1, wherein the non-light-emitting region comprises a first non-light-emitting region;
the metal structure comprises a gate electrode, a source electrode and a drain electrode of a thin film transistor (TFT) arranged at the first non-light-emitting region, a gate line connected to the gate electrode of the TFT and a data line connected to the source electrode of the TFT; and
the first light-absorbing layer is arranged at the first non-light-emitting region.

3. The array substrate according to claim 1, wherein the anode comprises a first transparent conductive layer, a second transparent conductive layer and a nontransparent metal layer arranged between the first transparent conductive layer and the second transparent conductive layer.

4. The array substrate according to claim 1, wherein the anode comprises a first transparent conductive layer, a second transparent conductive layer and a nontransparent metal layer arranged between the first transparent conductive layer and the second transparent conductive layer.

5. The array substrate according to claim 2, wherein the anode comprises a first transparent conductive layer, a second transparent conductive layer and a nontransparent metal layer arranged between the first transparent conductive layer and the second transparent conductive layer.

6. The array substrate according to claim 3, wherein the cathode is translucent.

7. The array substrate according to claim 2, wherein the anode is made of a transparent conductive material.

8. The array substrate according to claim 2, wherein the second light-absorbing layer is arranged at the first non-light-emitting region.

9. The array substrate according to claim 2, wherein the first light-absorbing layer and the second light-absorbing layer are made of a black matrix material.

10. The array substrate according to claim 2, wherein the non-light-emitting region further comprises a second non-light-emitting region arranged at a non-display region.

11. The array substrate according to claim 10, wherein the metal structure further comprises a metal line arranged at the second non-light-emitting region.

12. The array substrate according to claim 1, wherein the first light-absorbing layer is formed subsequent to the metal structure, and followed by the formation of the anode, so as to form the first light-absorbing layer between the metal structure and the anode.

13. The array substrate according to claim 1, wherein the organic light-emitting layer at least comprises light-emitting molecules capable of emitting red, green and blue light beams.

14. The array substrate according to claim 1, wherein the organic light-emitting layer comprises light-emitting molecules capable of emitting white light beams.

15. The array substrate according to claim 14, further comprising a color filter film arranged at the light-emitting region and at a light-exiting side.

16. The array substrate according to claim 10, wherein the first light-absorbing layer is arranged at both the first non-light-emitting region and the second non-light-emitting region.

17. An organic light-emitting diode (OLED) display panel comprising the array substrate according to claim 1.

18. A display device comprising the OLED display panel according to claim 17.

19. An array substrate, comprising a light-emitting region and a non-light-emitting region, wherein an anode, an organic light-emitting layer and a cathode on a base substrate are arranged at the non-light-emitting region, and a metal structure on the base substrate is arranged at the non-light-emitting region, wherein
the array substrate further comprises a first light-absorbing layer and a second light-absorbing layer arranged at the non-light-emitting region and configured to absorb a light beam from the organic light-emitting layer and arriving at the non-light-emitting region, and the cathode is transparent, and the anode is transparent or nontransparent, wherein the first light-absorbing layer is arranged between the metal structure and the anode, the second light-absorbing layer is located at a side of the base substrate away from the metal structure, and the metal structure is arranged between the first light-absorbing layer and the second light-absorbing layer.

\* \* \* \* \*